US012640641B2

(12) United States Patent　　　　(10) Patent No.:　US 12,640,641 B2
Shapiro et al.　　　　　　　　　　　(45) Date of Patent:　May 26, 2026

(54) REDUCED DEADTIME HALF BRIDGE

(71) Applicant: Visic Technologies Ltd., Ness Ziona (IL)

(72) Inventors: David Shapiro, Rishion LeZion (IL); Gleb Vetakh, Ashdod (IL); Dmitry Novo, Kibbutz Beit-Govrin (IL); Gregory Bunin, Tel Aviv (IL)

(73) Assignee: VISIC TECHNOLOGIES LTD, Nes Ziona (IL)

( * ) Notice: Subject to any disclaimer, the term of this patent is extended or adjusted under 35 U.S.C. 154(b) by 200 days.

(21) Appl. No.: 18/487,154

(22) Filed: Oct. 16, 2023

(65) Prior Publication Data

US 2025/0125713 A1　　Apr. 17, 2025

(51) Int. Cl.
　　*H02M 1/38*　　　(2007.01)
　　*H02M 1/00*　　　(2007.01)
　　*H02M 1/088*　　(2006.01)
(52) U.S. Cl.
　　CPC ......... *H02M 1/088* (2013.01); *H02M 1/0054* (2021.05); *H02M 1/38* (2013.01); *H02M 1/0009* (2021.05); *H03K 2217/0063* (2013.01); *H03K 2217/0072* (2013.01)

(58) Field of Classification Search
　　CPC . H02M 1/38–38; H02M 1/088; H02M 1/0009
　　See application file for complete search history.

(56) References Cited

U.S. PATENT DOCUMENTS

| | | | | |
|---|---|---|---|---|
| 2014/0063883 A1* | 3/2014 | Familiant | ................ | H02M 1/38 |
| | | | | 363/131 |
| 2016/0036433 A1* | 2/2016 | Toshiyuki | ............... | H02M 1/08 |
| | | | | 327/109 |
| 2019/0229655 A1* | 7/2019 | Balakrishnan | .......... | H02P 27/08 |
| 2019/0356249 A1* | 11/2019 | Linggajaya | ........ | G11B 19/2081 |
| 2023/0137346 A1* | 5/2023 | Poli | ........................... | H02P 7/29 |
| | | | | 318/400.17 |
| 2023/0370056 A1* | 11/2023 | Poletto | .................... | H02M 1/32 |

* cited by examiner

*Primary Examiner* — Sisay G Tiku

(74) *Attorney, Agent, or Firm* — A.C. Entis-IP Ltd; Allan C. Entis

(57)　　　　　　　ABSTRACT

A half bridge comprising: a high side (HS) transistor; a low side (LS) transistor connected in series with the high side transistor at an output node of the half bridge; and a third quadrant state (TQS) detector connected in parallel with the HS or LS transistor and in series respectively with the LS and/or HS transistor, which TQS detector generates a signal responsive to a direction of a voltage drop across the transistor that is in parallel with the TQS detector.

14 Claims, 8 Drawing Sheets

REDUCED DEADTIME HALF BRIDGE

FIELD

Embodiments of the invention relate to providing a half bridge circuit having reduced deadtime power losses.

BACKGROUND

A common element of many circuits, in particular high-power conversion circuits, is a half bridge or a full bridge, which comprises two half bridges. A half bridge comprises first and second switches, generally MOSFET transistors, connected in series at a junction that functions as an output node of the half bridge.

In operation to electrically connect a power source to a load the first MOSFET transistor of a half bridge is connected to a positive terminal of the power source and the second MOSFET transistor, is connected to a negative terminal of the power source. Conventionally, the transistor connected to the positive terminal is referred to as a high side (HS) transistor and the transistor connected to the negative terminal is referred to as a low side (LS) transistor. Dedicated, HS and LS gate drivers are respectively connected to the gates of the HS and LS transistors and control the transistors to be ON (closed, conducting) and OFF (open, non-conducting) in various combinations to electrically connect and disconnect the load to the power source.

When a half bridge is used on its own to electrically connect and disconnect a DC power source to a load to provide the load with pulses of electrical power, the load is connected between the output node of the half bridge and either the positive or negative terminal of the power source. The load is therefore connected in parallel with one and in series with the other of the HS and LS transistors. The gate drivers control the transistors to turn OFF the transistor that is in parallel with the load and turn ON the transistor that is in series with the load to electrically connect the power source to the load and provide power to the load. The gate driver of the transistor that is in series with the load turns OFF the series transistor to electrically disconnect the load from the power source and interrupt power to the load.

When a full bridge is used to electrically connect a power source to a load, the load is connected between the output nodes of the half bridges comprised in the full bridge. The high side transistors of the half bridges are connected to the positive terminal of the power source and the low side transistors of the half bridges are connected to the negative terminal of the power source. To electrically connect the power source to the load the gate drivers control the transistors to turn ON the high side transistor and turn OFF the low side transistor of one of the half bridges and turn OFF the high side transistor and turn ON the low side transistor of the other of the half bridges. The gate drivers alternate which of the half bridges has the high side transistor turned ON and the low side transistor turned OFF to drive an alternating current through the load.

Whether operating alone or as part of a full bridge to electrically connect a power source to a load, to prevent a "shoot-through" rush of current through the half bridge that may damage the half bridge transistors, the power source, and/or an element of a circuit that comprises the power source, the HS and LS gate drivers are controlled in synchrony so that when one of the transistors in the half bridge is ON the other is OFF.

Since switching times of the HS and LS transistors are invariably subject to various types of jitter, drift, and/or characteristics of a load to which they are connected, to aid in protecting the power supply from shorting, the gate drivers are synchronized to control both transistors to be OFF for a short period of time, referred to as a deadtime period or simply a deadtime, after electrically disconnecting the load from the power source and before electrically re-connecting the load to the power source. Typically, deadtimes of the half bridge after electrically disconnecting and before electrically re-connecting the load respectively from and to the power source are separated by a state of the half bridge, optionally referred to as an interim state. In the interim state the transistor in series with the load is turned OFF and the transistor in parallel with the load is turned ON to short the load. If the load is inductive, during the deadtimes and the interim state between the deadtimes, the load operates to sustain current flow through the load in a same direction through the load, optionally referred to as a legacy direction, that prevailed prior to the deadtimes. During the deadtimes and interim states the load therefore draws current in a direction through the parallel transistor that generates a voltage drop, referred to as a reverse voltage drop, across the transistor in a direction that is opposite to the voltage drop prevailing across the transistor when the load is electrically connected to the power supply. Whereas the current flowing through the parallel transistor that is associated with the reverse voltage across the transistor flows through the load in the legacy direction of the load, the current may be referred to as a reverse current. The reverse current and associated reverse voltage during the deadtimes result in power losses that contribute to thermal stress of the switch. The power loss and thermal stress are particularly obtrusive for half bridges for which the transistors are GaN (gallium nitride) transistors.

SUMMARY

An aspect of an embodiment of the disclosure relates to providing a half bridge characterized by reduced duration of deadtime periods during which one of the LS and HS transistors of the half bridge is turned OFF and experiences a reverse voltage and concomitant reverse current. To provide reduced deadtimes, the half bridge comprises a voltage detector, also referred to as a third quadrant state (TQS) detector, which detects voltage across the LS or HS transistor that experiences the reverse voltage during deadtime periods and generates signals responsive to the detected voltage that is indicative of a state of the half bridge as a function of the ON and OFF states of the LS and HS transistors. The TQS detector transmits the signals responsive to the sensed reversed voltage to a controller that controls the gate drivers of the transistors. The controller is configured to control the gate driver of the LS or HS transistor experiencing the reverse voltage to turn ON the transistor and thereby shorten duration of the deadtime period after determining from the transmitted signals that the other of the LS or HS transistor of the half bridge is OFF. In an embodiment the LS and HS transistors comprise respective GaN transistors that are switched between ON and OFF states to control states of the half bridge.

It is noted that whereas in the figures, discussion of the figures, and claims a half bridge in accordance with an embodiment is presented as comprising a single HS transistor and a single LS transistor, a half bridge in accordance with an embodiment may comprise a plurality of HS transistors in parallel and/or a plurality of LS transistors in parallel. Reference to a HS transistor is therefore understood to be a reference to at least one HS transistor and reference to an LS transistor is understood to be a reference to at least one LS transistor.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE FIGURES

Non-limiting examples of embodiments of the invention are described below with reference to figures attached hereto that are listed following this paragraph. Identical features that appear in more than one figure are generally labeled with a same numeral in all the figures in which they appear. A label labeling an icon representing a given feature in a figure of an embodiment of the disclosure may be used to reference the given feature. Dimensions of components and features shown in the figures are chosen for convenience and clarity of presentation and are not necessarily shown to scale.

FIG. 2A-FIG. 2D schematically illustrate operation of the half bridge shown in FIG. 1 when cycling between ON, deadtime, and interim states, in accordance with prior art; amd

FIGS. 4A-4D schematically illustrate operation of the half bridge shown in FIG. 3 when cycling between ON and interim states interleaved with deadtimes, in accordance with prior art.

DETAILED DESCRIPTION

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment in an application for which it is intended. Wherever a general term in the disclosure is illustrated by reference to an example instance or a list of example instances, the instance or instances referred to, are by way of non-limiting example instances of the general term, and the general term is not intended Wherever a general term in the disclosure is illustrated by reference to an example instance or a list of example instances, the instance or instances referred to, are by way of non-limiting example instances of the general term, and the general term is not intended to be limited to the specific example instance or instances referred to. The phrase "in an embodiment", whether or not associated with a permissive, such as "may", "optionally", or "by way of example", is used to introduce for consideration an example, but not necessarily required, configuration of possible embodiments of the disclosure. Each of the verbs, "comprise" "include" and "have", and conjugates thereof, are used to indicate that the object or objects of the verb are not necessarily a complete listing of components, elements or parts of the subject or subjects of the verb. Unless otherwise indicated explicitly or by context, the word "or" in the description and claims is considered to be the inclusive "or" rather than the exclusive or, and indicates at least one of, or any combination of more than one of items it conjoins.

Figure 1:
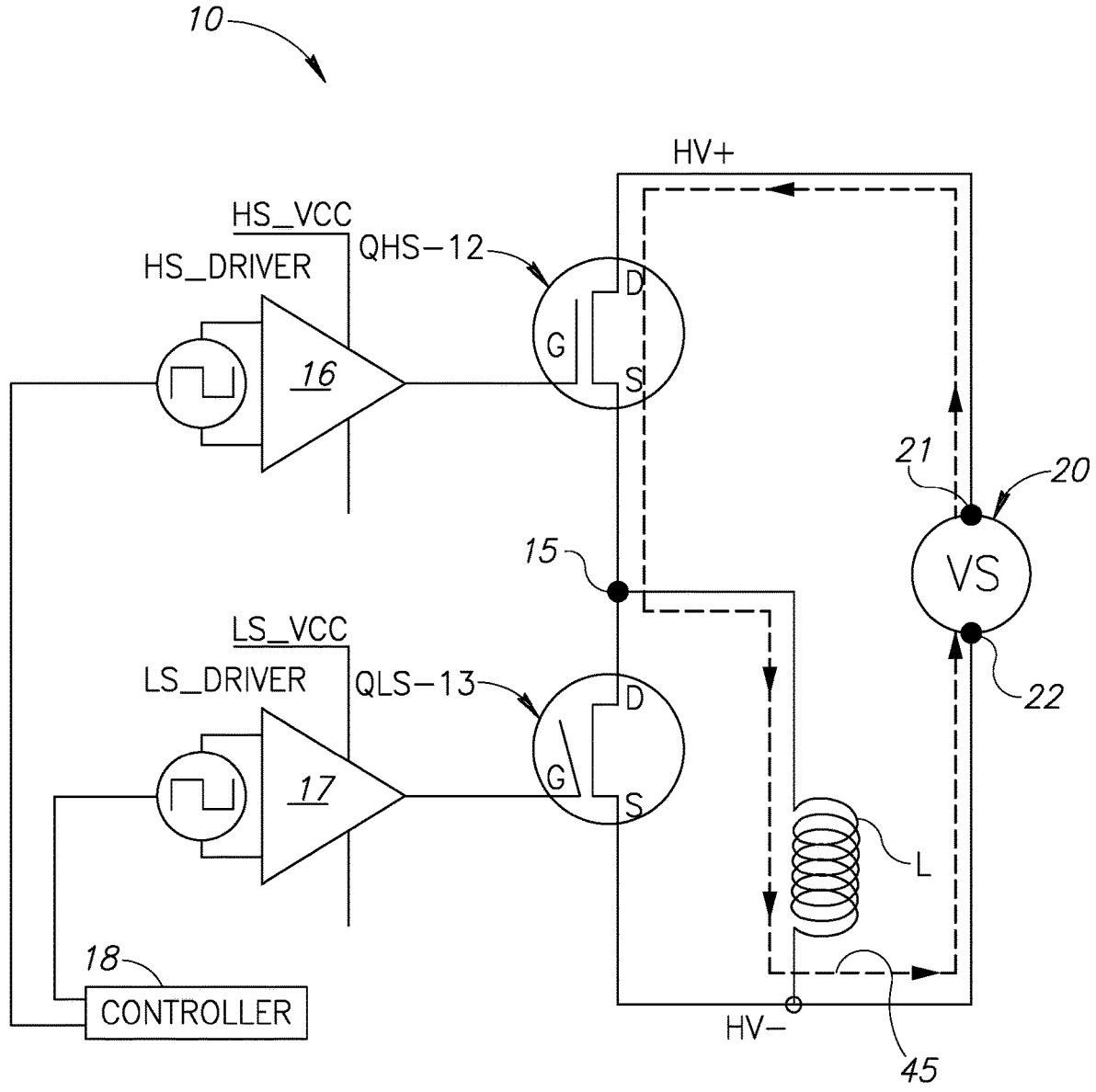
FIG. 1 schematically shows a half bridge, in accordance with prior art.
Figure 2:
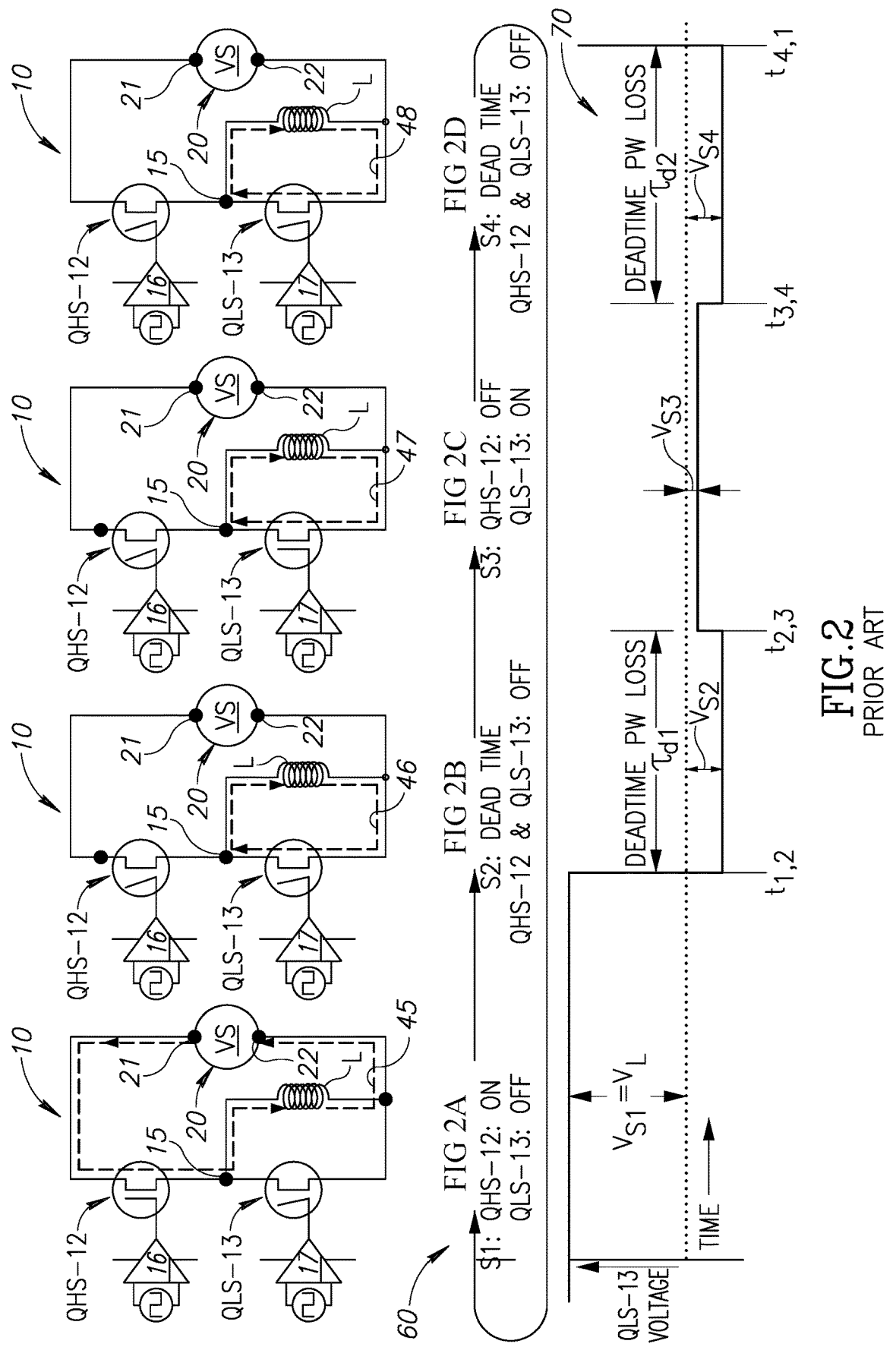
FIG. 2 shows a graph exhibiting transition times between the states shown in FIGS. 2A-2D and voltage across the low side transistor in the half bridge shown in FIG. 1 during the states.

FIG. 1 schematically shows a half bridge 10 in accordance with prior art that is common to many conversion circuits. Half bridge 10 includes a high side switch QHS-12 and a low side switch QLS-13, generally MOSFET transistors, connected in series at a junction 15 that functions as an output node of the half bridge. Each transistor has a source S, a drain D, and a gate G. A high side gate driver 16 is connected between gate G and source S of transistor QHS-12 and controls QHS-12 to be ON (closed) and conducting, or OFF (open) and non-conducting. Similarly, a low side gate driver 17 is connected between source S and a gate G of low side transistor QLS-13 and controls the low side transistor to be ON or OFF. A controller 18 controls gate drivers 16 and 17 to operate in synchrony so that when one of QHS-12 and QHS-13 is ON the other is OFF to provide power to a load from a power supply connected to the half bridge without shorting the power supply.

In FIG. 1, by way of example, half bridge 10 is shown connected to a load L and to a high voltage power source 20 that provides a high, optionally positive voltage HV+ terminal 21 and a voltage HV−, lower than HV+, at a terminal 22. Transistors QHS-12 and QLS-13 are assumed by way of example, to be n-channel, normally ON GaN transistors. Drain D of transistor QHS-12 is connected to HV+ terminal 21, and source S of transistor QLS-13 is connected to HV− terminal 22. By way of example, load L is connected between output node 15 of half bridge 10 and HV− terminal 22.

FIG. 1 shows half bridge 10 in a state, optionally referred to as a "half bridge ON state", or as referred to below as an S1 state, in which the half bridge electrically connects load L to power source 20, by having high side gate driver 16 controlling transistor QHS-12 to be ON) and low side driver 17 controlling transistor QLS-13 to be OFF. Transistors QHS-12 and QHS-13 are indicated as OFF when the line representing the gate in the symbol for the transistors is tilted away from the body of the transistor. The switches are indicated as ON when the line representing the gate lies parallel to the body of the transistor. As a result of QHS-12 being ON, output node 15 is set to voltage HV+ provided by terminal 21 and power supply 20 drives a current represented by a dashed arrowed line 45 through load L.

FIGS. 2A-2D schematically show high side driver 16 and low side driver 17 respectively controlling transistors QHS-12 and QLS-13 to turn ON and turn OFF and cycle half bridge 10 through a conventional, repeated sequence of states S1-S4 of the half bridge to alternately electrically connect and disconnect load L to voltage power source 20 and provide pulses of power to the load. The sequence of states is schematically designated along a timeline 60 below FIGS. 2A-2D and comprises a half bridge ON state, S1, in which half bridge 10 electrically connects load L to power source 20 followed by first deadtime state S2, an interim state S3, and a second deadtime state S4, after which the sequence repeats. Voltage across low side transistor QLS-13 during states S1-S4 of half bridge 10 is shown in FIG. 2 in a graph 70 below timeline 60. For convenience of presentation and reduce clutter controller 18 shown in FIG. 1 is not shown in FIGS. 2A-2D.

FIG. 2A schematically shows half bridge 10-in-state S1, as also depicted in FIG. 1, with QHS-12 ON and QLS-13 OFF and driving a current 45 through load L. In the state S1 voltage $V_{S1}$ across QLS-13 is equal to a positive voltage drop $V_L$ equal to that across load L. FIG. 2B schematically shows half bridge 10 after switching at a time $t_{1,2}$ from state S1 to first deadtime state S2 by switching QHS-12 OFF so that both QHS-12 and QLS-13 are OFF. However, whereas switching QHS-12 electrically disconnects load L from power source 20 during deadtime state S2, the inductance of load L operates to resist change in current 45 flowing in load L and the inductance forces a reverse current 46 to flow through QLS-13 that decays from an initial current having magnitude equal to magnitude of current 45. Because QLS-13 is OFF in state S2, the reverse current flow 46 generates a relatively large resistance to current flow and associated reverse (negative) voltage drop, $V_{S2}$, across QLS-13. As a result, during deadtime state S2, half bridge 10 evidences enhanced power dissipation and heating.

At a switching time $t_{2,3}$ following a predetermined delay $\tau_{d1}$ from switching time $t_{1,2}$ that precautions against turning QLS-13 ON before QHS-12 is safely OFF, half bridge 10 switches from deadtime state S2 to interim state S3 schematically shown in FIG. 2C by turning QLS-13 ON and leaving QHS-12 OFF. With QLS-13 ON, resistance to reverse current flow through QLS-13 decreases, and a decaying reverse current represented by a dashed line 47 continues to flow through QLS-13. As a result of the relatively low resistance to current flow during state S3, QLS-13 evidences a comparatively low negative voltage drop, $V_{S3}$, and concomitant relatively moderate dissipation of energy and heating. At a switching time $t_{3,4}$ half bridge 10 switches QLS-13 to OFF and transitions from interim state S3 to second deadtime state S4 shown in FIG. 2D. During second deadtime state S4 a reverse current 48 flows through QLS-13, and because QLS-13 is OFF, as in first deadtime state S2, during second deadtime S4, QLS-13 is characterized by a relatively elevated resistance to current flow. As a result, during deadtime S4 QLS-13 exhibits an elevated negative voltage drop, $V_{S4}$, and half bridge 10 evidences enhanced power dissipation and heating. At a switching time $t_{4,1}$ following a predetermined delay $\tau_{d2}$ from switching time $t_{3,4}$ that precautions against turning QHS-12 ON before QLS-13 is safely OFF, half bridge 10 switches from deadtime state S4 to state S1 to again provide power to load L and cycle through states S2-S4.

Figure 3:
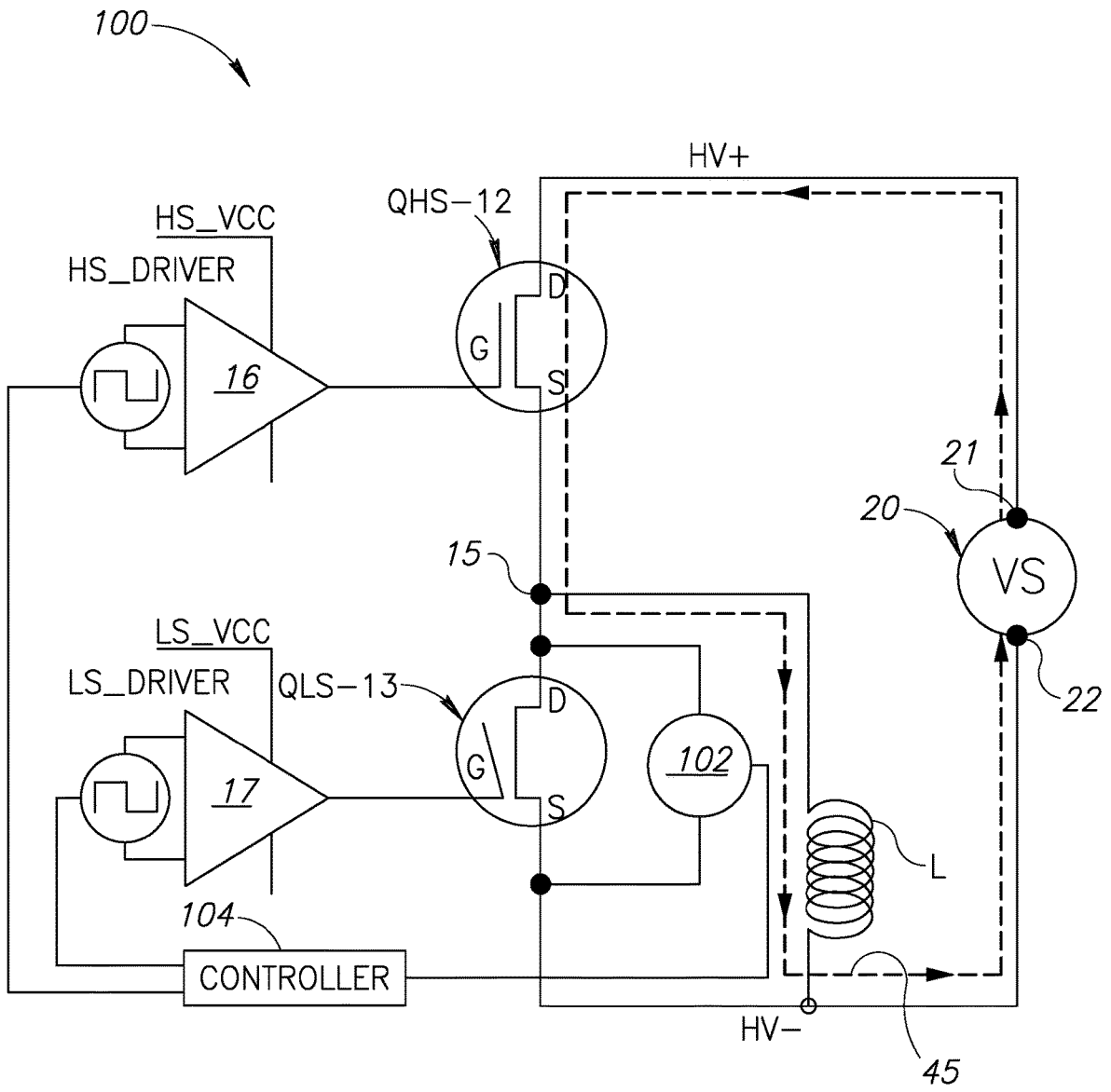
FIG. 3 schematically shows a half bridge comprising a third quadrant state (TQS) detector and controller for controlling duration of a deadtime responsive to signals generated by the TQS detector, in accordance with an embodiment of the disclosure.
Figure 4:
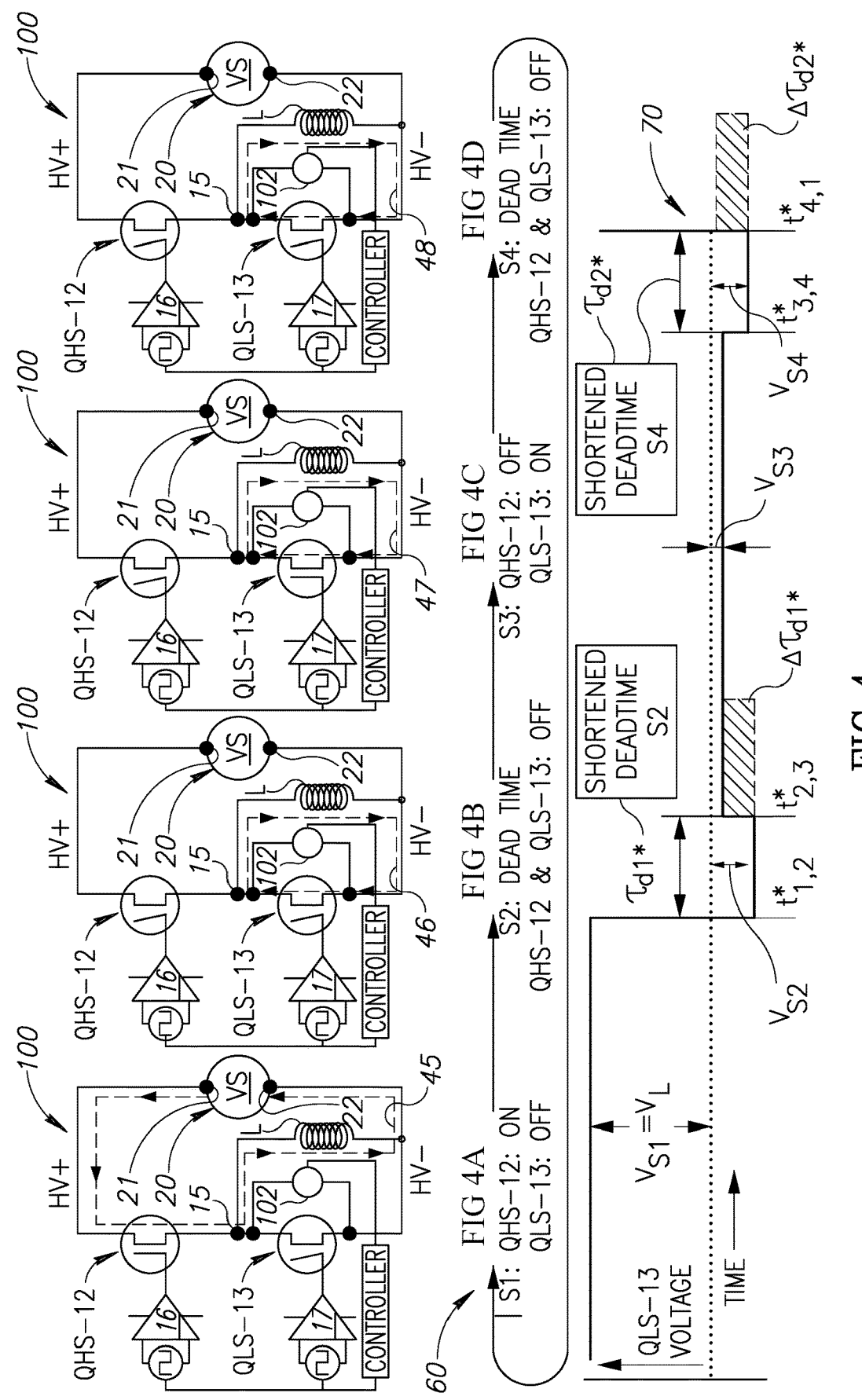
FIG. 4 shows a graph exhibiting transition times between the states shown in FIGS. 4A-4D and voltage across the low side transistor in the half bridge shown in FIG. 3 during the states.

FIG. 3 schematically shows details of a half bridge 100, in accordance with an embodiment of the disclosure. Half bridge 100 optionally comprises the same components as half bridge 10, but in addition comprises a TQS detector 102 that generates signals responsive to voltage direction across QLS-13 and transmits the signals to a controller 104 that receives the signals. In accordance with an embodiment, controller 104 is configured to process the received signals to determine the states of QHS-12 and QLS-13 and thereby of half bridge 100 during operation of the half bridge. In response to the determined states, controller 104 controls when gate drivers 17 and 16 turn ON QLS-13 and QHS-12 respectively to shorten durations of deadtimes S2 and S4.

As described below, TQS detector 102 and controller 104 cooperate to replace predetermined durations $\tau_{d1}$ and $\tau_{d2}$ of respective deadtime states S2 and S4 characterizing operation of half bridge 10 with dynamic deadtime durations $\tau_{d1}*$ and $\tau_{d2}*$. The dynamically determined deadtime durations $\tau_{d1}*$ and $\tau_{d2}*$ are functions of real time ON and OFF states of QHS-12 and QLS-13 and are generally shorter than prior art, predetermined deadtime durations $\tau_{d1}$ and $\tau_{d2}$. As a result, energy dissipation and heating experienced by half bridge 100 during deadtime states S2 and S4 of half bridge 100 are less than energy dissipation and heating experienced by half bridge 10 during the deadtimes.

FIGS. 4A-4D schematically illustrate TQS detector 102 and controller 104 cooperating to control operation of half bridge 100 and dynamically determine durations of deadtimes of the half bridge as the half bridge cycles through a sequence of ON, interim, and deadtime states S1-S4 to provide load L with power, in accordance with an embodiment of the disclosure. Voltage across low side transistor QLS-13 during states S1-S4 of half bridge 100 is shown in FIG. 4 in graph 70 below timeline 60.

FIG. 4A schematically shows half bridge 100 in the same ON state S1 as shown in FIG. 2A for half bridge 10 and operating similarly to half bridge 10 with QHS-12 ON and QLS-13 OFF and driving a current 45 through load L. At a time $t*_{1,2}$ gate driver 16 turns OFF QHS-12 to transition half bridge 100 from state S1 to first deadtime state S2 by switching QHS-12 OFF so that both QHS-12 and QLS-13 are OFF. As in the case of half bridge 10 after switching to deadtime S2 load L forces a reverse current 46 to flow through QLS-13 and voltage across QLS-13 drops to negative reverse voltage $V_{S2}$. In an embodiment, in response to negative reverse voltage $V_{S2}$, TQS detector 102 sends a signal to controller 104 to indicate that the voltage across QLS-13 has dropped from positive voltage $V_L$ to negative reverse voltage $V_{S2}$. Controller 104 processes the received signal and determines that QHS-12 is safely turned OFF, that QLS-13 may therefore be turned ON to switch half bridge 100 to interim state S3, and controls gate driver 17 at a time $t*_{2,3}$ to turn ON QLS-13. In an embodiment a duration $\tau_{d1}*=(t*_{2,3}-t*_{1,2})$ of deadtime S2 determined responsive to change in voltage across QLS-13, may be substantially equal to a processing latency, $\tau_p$, incurred by TQS detector 102, processor 104, and gate controller 16 in providing voltage to gate G of QLS-13 that turns ON QLS-13. In an embodiment the dynamically determined deadtime duration, $\tau_{d1}*$, may be substantially less than an average prior art predetermined deadtime duration $\tau_{d1}$. A hatched rectangular region $\Delta\tau_{d1}$ schematically represents an advantageous reduction in deadtime duration for deadtime S2 that may be achieved by half bridge 100 in accordance with an embodiment of the disclosure relative to an average prior art deadtime duration for deadtime S2.

At a time $t*_{3,4}$, in anticipation of turning ON high side QHS-12 of half bridge 100 again to provide load L with power, controller 104 controls gate driver 17 to turn OFF QLS-13 and switch half bridge 100 to deadtime S4. As in the case of switching to deadtime S2, in response to turning OFF QLS-13 and switching to deadtime S4, resistance of QLS-13 to current flow increases and load L forces a reverse current 48 through QLS-13 to oppose change in current flowing through load L. As a result the negative voltage drop across QLS-13 increase from $V_{S3}$ to $V_{S4}$ and TQS detector 102 generates and transmits a signal to controller 104 indicating the change in voltage. In response to the signal from TQS detector 102 controller 104 determines that QLS-13 is safely OFF, and controls gate driver 16 at a time $t^*_{4,1}$ to turn ON QHS-12 and switch the half bridge to S1 to provide power to load L. As in the case of deadtime duration $\tau_{d1}^*$ for deadtime state S2, a duration $\tau_{d2}^*=(t^*_{4,1}-t^*_{3,4})$ of deadtime S4 may be substantially equal to a processing latency, $\tau_p$, incurred by TQS detector 102, processor 104, and gate controller 16 in providing voltage to gate G (FIG. 3) of QHS-12 that turns ON QHS-12 and transitions half bridge 100 to S1. A hatched rectangular region $\Delta\tau_{d2}$ schematically represents an advantageous reduction in deadtime duration for deadtime period S4 that may be achieved by half bridge 100, in accordance with an embodiment of the disclosure relative to an average prior art deadtime duration for deadtime S4.

It is noted that conventional predetermined deadtime durations are determined responsive to statistical data characterizing operation of HS and LS switches comprised in prior art half bridges, such as half bridge 10 shown in FIGS. 1 and FIGS. 2A-2D, to reduce a probability that the half bridges fail by shoot-through. As a result, prior art deadtime durations are generally relatively large. For example, predetermined deadtime durations $\tau_{d1}$ and $\tau_{d2}$ for half bridge 10 determined from statistical specifications of switches QHS-12 and QLS-13 may be between about 100 and 500 ns (nanoseconds). On the other hand, deadtime durations $\tau_{d1}^*$ and $\tau_{d2}^*$ determined in accordance with an embodiment of the disclosure for half bridge 100 are determined dynamically during operation of the half bridge responsive to the real time states of high side and low side switches QHS-12 and QLS-13 as determined from voltage signals provided by TQS detector 102. The deadtime durations $\tau_{d1}^*$ and $\tau_{d2}^*$ therefore do not require relatively large statistically determined safety margins to protect half bridge 100 against shoot-through due to uncertainty in the actual states of QHS-12 and QLS-13 during operation of the half bridge. As a result, deadtime durations $\tau_{d1}^*$ and $\tau_{d2}^*$ in accordance with an embodiment may be significantly shorter than predetermined deadtimes $T_{d1}$ and $T_{d2}$ and noted above and may be less than about 80 ns or less than about 50 ns.

Figure 5A:
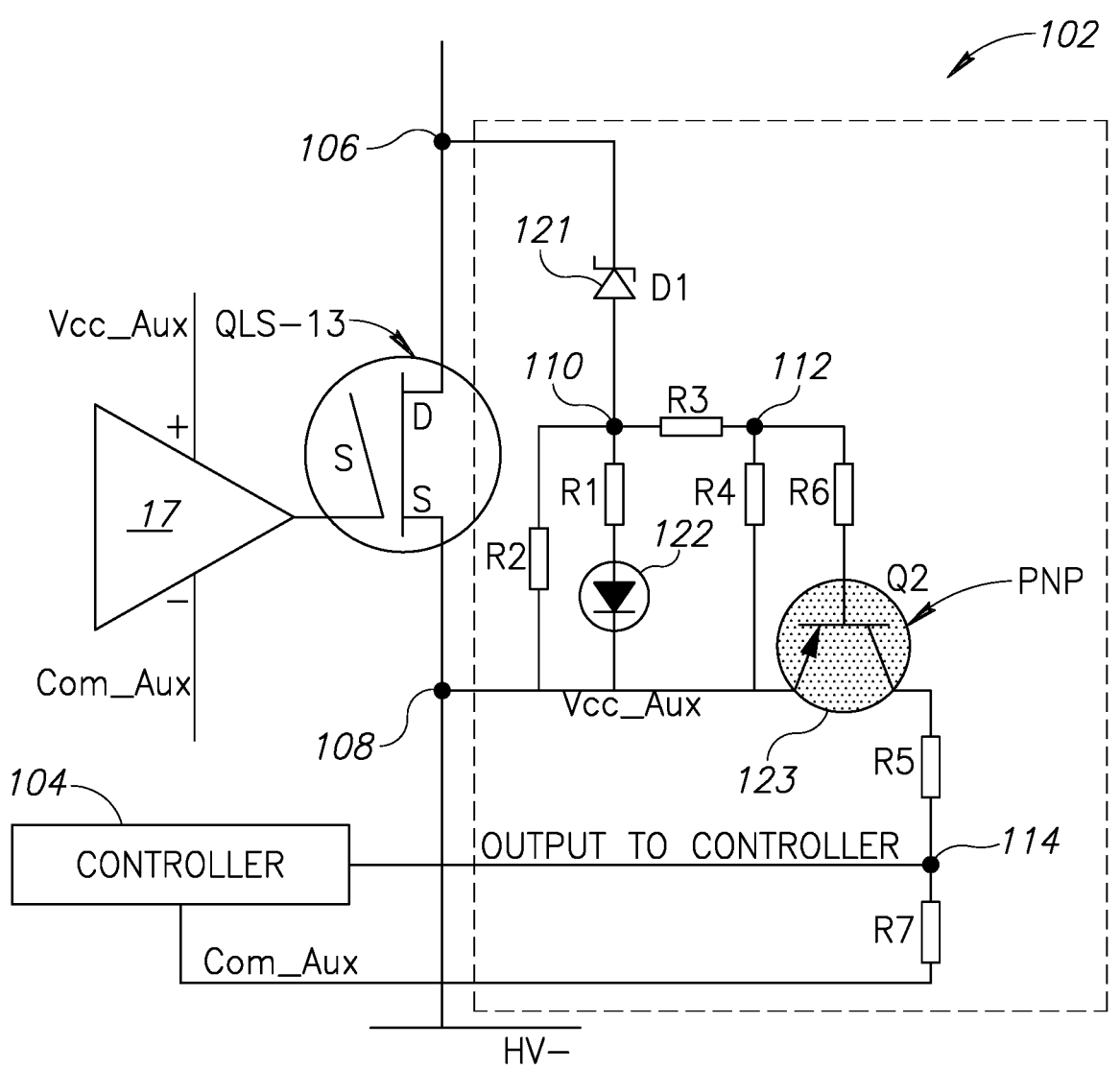
FIGS. 5A and 5B schematically show circuit diagrams for TQS detectors, in accordance with an embodiment of the disclosure.

FIG. 5A schematically shows a portion of half bridge 100 shown in FIGS. 4A-4D that displays a circuit configuration, indicated by a dashed border, for TQS detector 102, in accordance with an embodiment of the disclosure.

TQS detector 102 optionally comprises a PNP transistor 123, resistors R1, R2, . . . R7, a high voltage, fast recovery, optionally Schottky diode 121, and a Zener diode 122. The TQS detector is coupled to half bridge 100 at nodes 106 and 108 at drain D and source S respectively of low side transistor QLS-13 and generates logic levels at an output node 114 responsive to polarity of voltage between nodes 106 and 108. The output node is connected to controller 104 to provide the controller with the logic levels. TQS detector 102, controller 104, and gate driver 17 are provided with power at voltages Vcc_Aux and Com_Aux. Operation of TQS detector 102 circuitry shown in FIG. 5A is discussed below with reference to each of states S1-S4 exhibited in FIGS. 4A-4D. Voltages at nodes 106, 108, and output node 114 and at nodes 110, 112 germane to the discussion are indicated by a "V" before the label referencing the node. For example, voltage at nodes 106 and 108 are referred to as V106 and V108 respectively.

In state S1 (FIG. 4A) of half bridge 100 voltage V106 at node 106 is positive and generally much greater than voltage V108 at node 108. Diode 121, which advantageously is a relatively high voltage Schottky diode, is therefore reversed biased and OFF. As a result, very little current flows through resistor R2, voltage V110 is only slightly greater than V108, PNP transistor 123 is in a cut-off region and voltage V114 at output node 114 is at a low voltage, which output node 114 provides to controller 104 as a corresponding low logic level.

In state S2 of half bridge 100 (FIG. 4B) high side transistor QHS-12 and low side transistor QLS-13 are OFF, reverse current 46 flows through QLS-13 and generates a reverse voltage drop across transistor QLS-13 with V106 less than V108, which biases ON diode 121. As a result, V110 becomes approximately equal to V106 and generates a voltage V112 equal to about R4/(R3+R4) V106 that drives a base current to PNP transistor 123 through resistor R6 that puts the transistor into a high conductivity, "ON" state. A threshold voltage V112 at which the transistor 123 begins to turn to ON is determined by the ratio of resistors R4/(R3+R4). In the ON state of transistor 123 voltage divider R5/R7 is connected to Vcc-Aux and generates a high logic level substantially equal to R7/(R5+R7) Vcc_Aux at output node 114. Responsive to the high logic level, controller 104 turns ON transistor QLS-13, which decreases the reverse voltage and the voltage difference V106–V108 across the transistor and transitions half bridge 100 to state S3. In state S3 as a result of the decrease in reverse voltage across transistor QLS-13, base current to PNP transistor 123 and voltage to voltage divider R5/R7 decrease, and output voltage that output node 114 provides to controller 104 drops below the high logic level. In state S4 both QLS-12 and QLS-13 are OFF and reverse current and reverse voltage across QLS-13 are high, and TQS detector 102, as in state S2 of half bridge 100, provides a high logic at output node 114 to controller 104. Responsive to the high logic level, controller 104 turns ON transistor QHS-12, which decreases the reverse voltage and the voltage difference between V106–V108 across the transistor and transitions half bridge 100 to state S1. Resistor R1 and diode 122 operate to moderate positive voltage transients at node 110 that might damage transistor 123 when half bridge 100 cycles from state S4 back to state state S1.

It is noted that whereas in the above description load L is described and is shown in the figures as being connected in parallel with LS transistor, QLS-13, of half bridge 100, practice of embodiments of the disclosure are not limited to loads connected in parallel with LS transistors of half bridges. A load may be connected in parallel with the HS transistor and the low side transistor switched ON and OFF to connect and disconnect a load to and from a power source. Furthermore, whereas in the above description, high side and low side transistors in half bridge 100 are described as normally ON, depletion mode n-channel GaN transistors, a half bridge in accordance with an embodiment may comprise other than n-channel depletion mode transistors and associated TQS detectors configured to operate with other than n-channel depletion mode transistors. For example, a half bridge in accordance with an embodiment may comprise enhancement mode transistors, and/or p-channel transistors, and/or other than GaN transistors, and a TQS detector matched to the type of transistors the half bridge comprises.

Figure 5B:
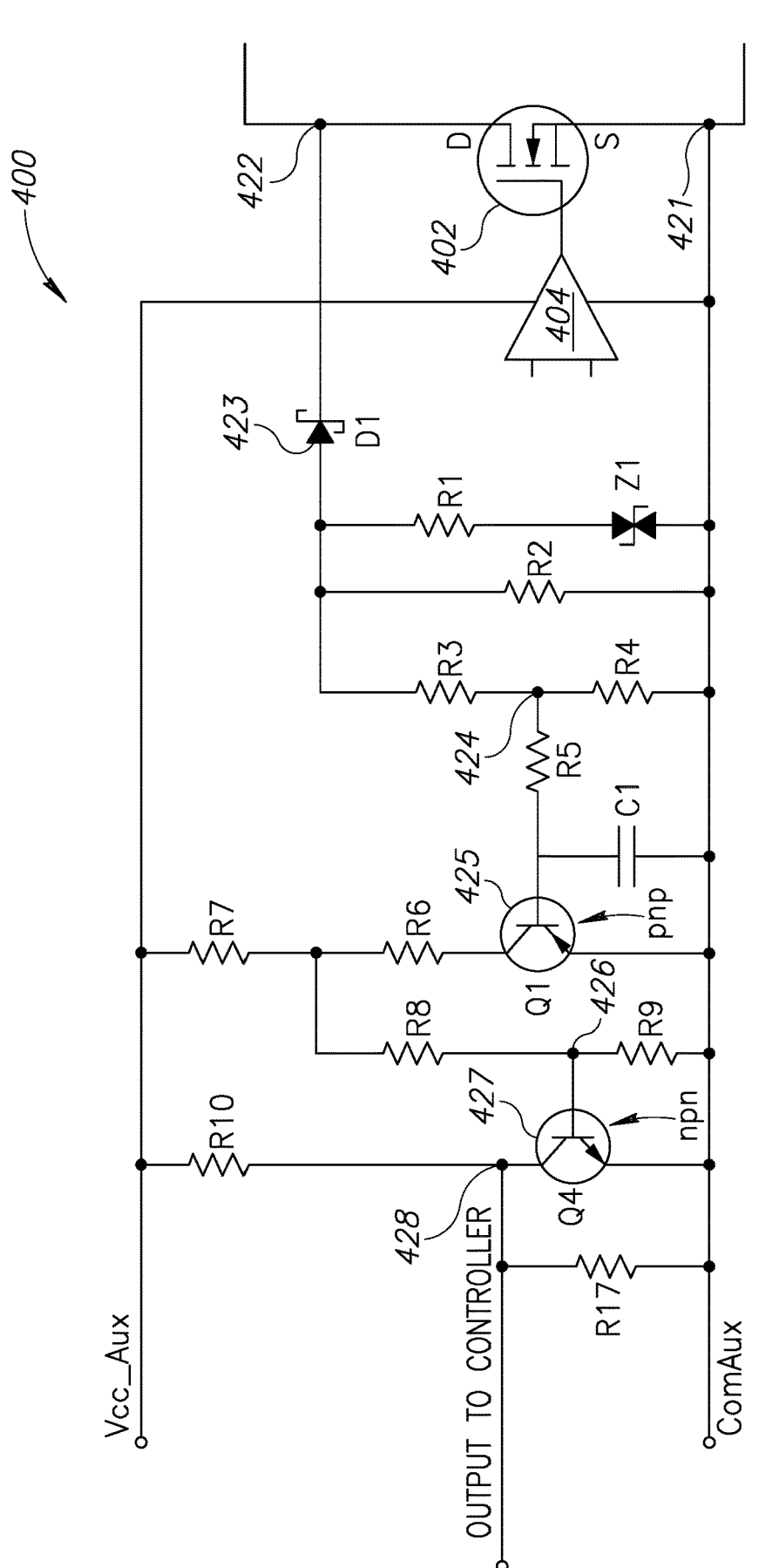

By way of example FIG. 5B schematically shows a TQS detector 400 configured to operate with an optionally n-channel enhancement mode transistor 402 driven by a gate driver 404 comprised in a half bridge (not shown), in accordance with an embodiment of the disclosure. TQS detector 400 operates similarly to TQS detector 102 and couples to a transistor 402 at nodes 421 and 422 at source S and drain D respectively of the transistor. The TQS detector generates output logic levels at an output node 428 for input to a controller (not shown). When no reverse voltage is detected across transistor 402 voltage at output node 428 is a low logic level.

When a reverse voltage is generated across transistor 402 high voltage Schottky diode 423 is biased ON to generate a negative voltage at node 424 that draws current through R5 from the base of PNP transistor 425 to turn ON the transistor. In response to transistor turning ON, a positive voltage at node 426 drives a current into the base of NPN transistor 427 that turns ON the transistor and reduces voltage from the high voltage logic level to a high logic level equal to about R17(R10+R17) (Vcc_Aux−ComAux).

In the above description, a half bridge is described providing power to a load connected in parallel with one transistor of the half bridge and in series with the other transistor of the half bridge. However, practice of embodiments of the disclosure are not limited to half bridges and loads connected in parallel with a transistor of half bridges. In accordance with an embodiment a plurality of half bridges may cooperate to provide power to a load. For example, a load may be coupled to a full bridge configured to provide power to the load and dynamically control deadtimes in accordance with an embodiment of the disclosure.

Figure 6A:
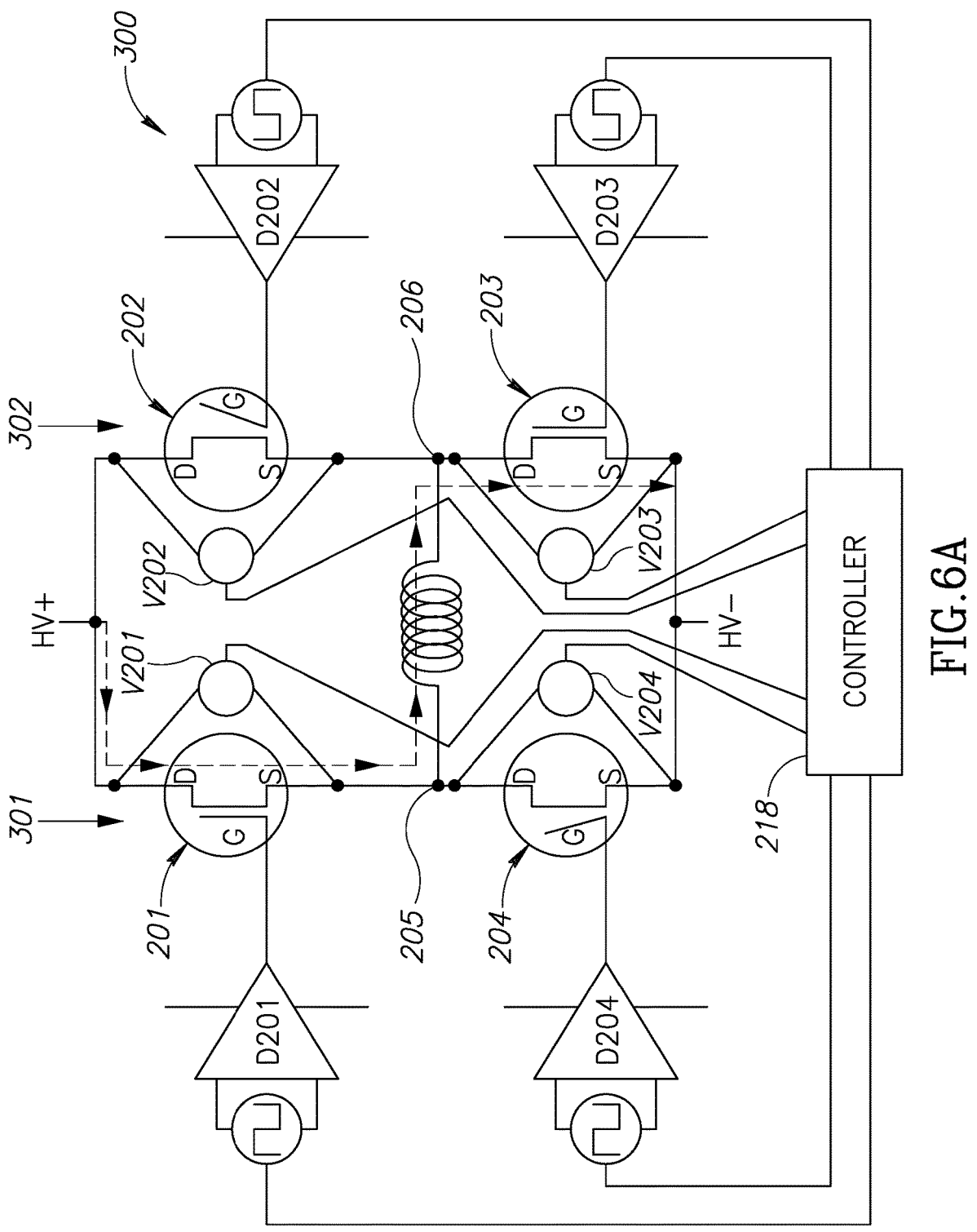
FIG. 6A schematically shows a full bridge comprising TQS detectors and a controller for controlling duration of a deadtime exhibited by the full bridge responsive to signals generated by the TQS detectors, in accordance with an embodiment of the disclosure.

FIG. 6A schematically shows a full bridge 300 connected to provide power to a load L and configured to dynamically determine deadtimes of the full bridge, in accordance with an embodiment of the disclosure.

Full bridge 300 comprises first and second half bridges 301 and 302 in accordance with an embodiment of the disclosure. Half bridge 301 comprises HS and LS, optionally n-channel GaN, transistors 201 and 204 respectively connected in series at an output node 205 of the half bridge. Gate drivers D201 and D204 are respectively connected to gates G of transistors 201 and 204 and are controlled by a controller 218 to turn ON and turn OFF the transistors. Half bridge 302 similarly comprises HS and LS, optionally n-channel GaN transistors 202 and 203 respectively connected in series at an output node 206 of half bridge 302. Gate drivers D202 and D203 are respectively connected to gates G of transistors 202 and 203 and are controlled by controller 218 to turn ON and turn OFF the transistors. TQS detectors V201, V202, V203, and V204 generate and transmit signals responsive to voltages across transistors 201, 202, 203, and 204 respectively and transmit the signals to controller 218.

Full bridge 300 is connected to a power source (not shown) that provides a positive voltage HV+ to drains D of transistors 201 and 202 and a voltage HV− to sources S of transistors 203 and 204. Load L is connected between output nodes 205 and 206. Controller 218 controls transistors 201-204 to configure electrical connection of the load to HV+ and HV− to drive an alternating current through the load. The controller processes the signals received from TQS detectors V201, V202, V203, and/or V204 in accordance with an embodiment to dynamically adjust deadtime states of full bridge 300, subject to verifying responsive to the signals that transistors in a same half bridge 301 and 302 are not ON at a same time.

Figure 6B:
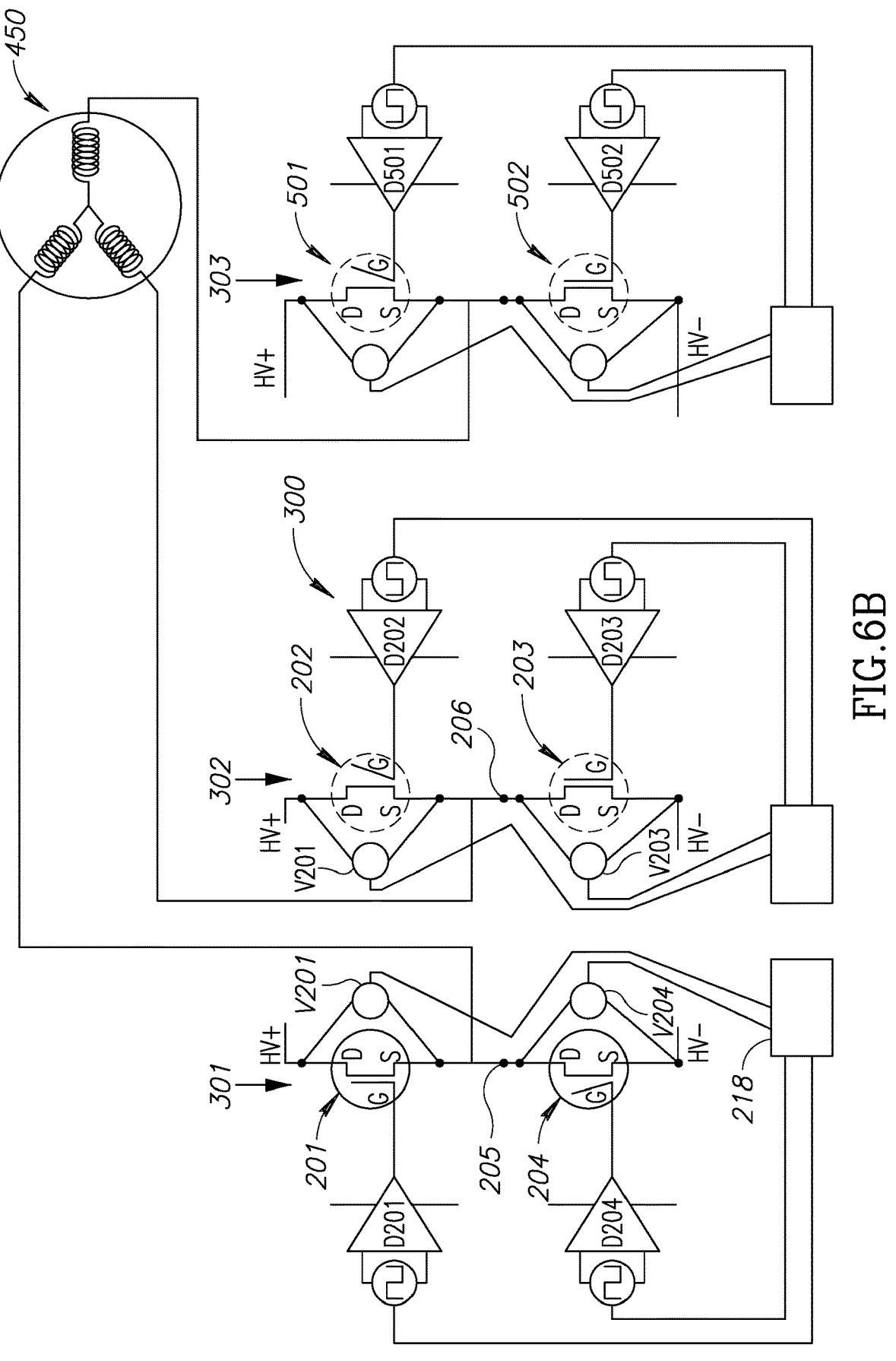
FIG. 6B schematically shows a plurality of three half bridges comprising TQS detectors and a controller for controlling duration of a deadtime exhibited by the full bridge responsive to signals generated, in accordance with an embodiment of the disclosure.

And by way of another example FIG. 6B schematically shows a plurality of three half bridges 301, 302 and 303 operating to provide power to a star configuration 450 of an electric motor as schematically shown in FIG. 6B, in accordance with an embodiment of the disclosure.

There is therefore provided in accordance with an embodiment of the disclosure, a half bridge comprising: a high side (HS) transistor; a low side (LS) transistor connected in series with the high side transistor at an output node of the half bridge; and a third quadrant state (TQS) detector connected in parallel with the HS or LS transistor and in series respectively with the LS and/or HS transistor, which TQS detector generates a signal responsive to a direction of a voltage drop across the transistor that is in parallel with the TQS detector.

Optionally the half bridge comprises a controller configured to turn ON and turn OFF the HS and LS transistors responsive to the signal. Optionally if the signal indicates an elevated reverse voltage the controller turns ON the HS or the LS transistor to reduce the elevated reverse voltage. Optionally if the signal indicating the elevated reverse voltage is received responsive to the half bridge switching to a dead time state of the half bridge, in which both HS and LS transistors are OFF, from a state in which the transistor in series with the TQS detector is ON and the transistor in parallel with the TQS detector is OFF, the controller operates to turn ON the transistor in parallel with the TQS detector. Optionally, the controller turns ON the transistor in parallel with the TQS detector following a first predetermined delay from a time at which the controller receives the signal indicating the elevated reverse voltage.

In an embodiment, if the signal indicating the elevated reverse voltage is received responsive to the half bridge switching to a dead time state of the half bridge in which both HS and LS transistors are OFF from an interim state of the half bridge in which the transistor in series with the TQS detector is OFF and the transistor in parallel with the TQS detector is ON, the controller operates to turn ON the transistor in series with the TQS detector. Optionally, wherein the controller turns ON the transistor in series following a second predetermined delay from a time at which the controller receives the signal indicating the elevated reverse voltage.

In an embodiment the transistor in parallel with the TQS detector is the HS transistor. Optionally the half bridge comprises an additional TQS detector connected in parallel with the LS transistor. In an embodiment the transistor in parallel with the TQS detector is the LS transistor. Optionally the half bridge comprises an additional TQS detector connected in parallel with the HS transistor.

In an embodiment at least one of the HS and LS transistors is a depletion mode transistor. In an embodiment at least one of the HS and LS transistors is an enhancement mode transistor.

There is further provided a system for controlling electrical connection of a load to a power supply comprising a plurality of half bridges in accordance with an embodiment of the disclosure. Optionally the plurality of half bridges comprises two half bridges. Optionally the plurality of half bridges comprises three half bridges.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A half bridge comprising:
   a high side (HS) transistor;
   a low side (LS) transistor connected in series with the high side transistor at an output node of the half bridge; and
   a third quadrant state (TQS) detector connected in parallel with the HS or LS transistor and in series respectively with the LS and/or HS transistor, which TQS detector generates a signal responsive to a direction of a voltage drop across the transistor that is in parallel with the TQS detector-;
   wherein if the signal indicates an elevated reverse voltage in the transistor in parallel with the TQS detector, the controller turns ON the transistor in parallel with the TQS detector to reduce the elevated reverse voltage, and if the signal indicating the elevated reverse voltage is received responsive to the half bridge switching from a state in which the transistor in series with the TQS detector is ON and the transistor in parallel with the TQS detector is OFF to a dead time state of the half bridge, in which both HS and LS transistors are OFF, the controller operates to turn ON the transistor in parallel with the TQS detector to switch the half bridge to an interim state in which the transistor in series with the TQS is OFF and the transistor in parallel with the TQS is ON.

2. The half bridge according to claim 1 wherein the controller turns ON the transistor in parallel with the TQS detector following a first predetermined delay from a time at which the controller receives the signal indicating the elevated reverse voltage.

3. The half bridge according to claim 1 wherein if the signal indicating the elevated reverse voltage is received responsive to the half bridge switching to a dead time state of the half bridge in which both HS and LS transistors are OFF from an interim state of the half bridge in which the transistor in series with the TQS detector is OFF and the transistor in parallel with the TQS detector is ON, the controller operates to turn ON the transistor in series with the TQS detector.

4. The half bridge according to claim 3 wherein the controller turns ON the transistor in series following a second predetermined delay from a time at which the controller receives the signal indicating the elevated reverse voltage.

5. The half bridge according to claim 1 wherein the transistor in parallel with the TQS detector is the HS transistor.

6. The half bridge according to claim 2 and comprising an additional TQS detector connected in parallel with the LS transistor.

7. The half bridge according to claim 1 wherein the transistor in parallel with the TQS detector is the LS transistor.

8. The half bridge according to claim 7 and comprising an additional TQS detector connected in parallel with the HS transistor.

9. The half bridge according to claim 1 wherein at least one of the HS and LS transistors is a depletion mode transistor.

10. The half bridge according to claim 1 wherein at least one of the HS and LS transistors is an enhancement mode transistor.

11. A system for controlling electrical connection of a load to a power supply comprising a plurality of half bridges according to claim 1.

12. The system according to claim 11 wherein the plurality of half bridges comprises two half bridges.

13. The system according to claim 11 wherein the plurality of half bridges comprises three half bridges.

14. A half bridge comprising:
   a high side (HS) transistor;
   a low side (LS) transistor connected in series with the high side transistor at an output node of the half bridge; and
   a third quadrant state (TQS) detector connected in parallel with the HS or LS transistor and in series respectively with the LS and/or HS transistor, which TQS detector generates a signal responsive to a direction of a voltage drop across the transistor that is in parallel with the TQS detector;
   wherein if the signal indicates an elevated reverse voltage in the transistor in parallel with the TQS detector, the controller turns ON the transistor in parallel with the TQS detector to reduce the elevated reverse voltage if the signal indicating the elevated reverse voltage is received responsive to the half bridge switching to a dead time state of the half bridge in which both HS and LS transistors are OFF from an interim state of the half bridge in which the transistor in series with the TQS detector is OFF and the transistor in parallel with the TQS detector is ON, the controller operates to turn ON the transistor in series with the TQS detector.

* * * * *